United States Patent
Sakoda et al.

(10) Patent No.: US 7,521,325 B2
(45) Date of Patent: Apr. 21, 2009

(54) SEMICONDUCTOR DEVICE AND METHOD FOR FABRICATING THE SAME

(75) Inventors: Tsunehisa Sakoda, Kawasaki (JP); Masaomi Yamaguchi, Kawasaki (JP); Hiroshi Minakata, Kawasaki (JP); Yoshihiro Sugita, Kawasaki (JP); Kazuto Ikeda, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 112 days.

(21) Appl. No.: 11/190,911

(22) Filed: Jul. 28, 2005

(65) Prior Publication Data
US 2006/0214243 A1   Sep. 28, 2006

(30) Foreign Application Priority Data
Mar. 28, 2005   (JP) ............................. 2005-092227

(51) Int. Cl.
*H01L 29/72* (2006.01)
(52) U.S. Cl. .................. 438/287; 438/197; 438/216; 438/261; 438/265; 438/769; 438/770; 438/786; 257/371; 257/410
(58) Field of Classification Search ............... 257/371, 257/410; 438/197, 216, 261, 265, 287, 769, 438/770, 786
See application file for complete search history.

(56) References Cited

U.S. PATENT DOCUMENTS 5,340,762 A * 8/1994 Vora ............................ 438/207

2004/0188778 A1* 9/2004 Aoyama .................... 257/410

FOREIGN PATENT DOCUMENTS

| JP | 2000-307083 A | 11/2000 |
| JP | 2003-110100 A | 4/2003 |
| JP | 2003-303820 | 10/2003 |

OTHER PUBLICATIONS

Korean Office Action dated Jul. 24, 2006, issued in corresponding Korean Patent Application No. 10-2005-0076114.
Y. Morisaki et al., "Ultra-thin ($T_{eff}^{inv}$=1.7 nm) Poly-Si-gated SiN/HfO$_2$/SiON High-k Stack Dielectrics with High Thermal Stability (1050° C.)", 2002 IEE, IEDM, pp. 861-864.
Chinese Office Action dated Mar. 7, 2008; issued in corresponding Chinese Application No. 200510096571.0.
Prior Art Information List.
Japanese Office Action dated Nov. 20, 2007, issued in corresponding Japanese Application No. 2005-092227.

* cited by examiner

*Primary Examiner*—Edward Wojciechowicz
(74) *Attorney, Agent, or Firm*—Westerman, Hattori, Daniels & Adrian, LLP.

(57) ABSTRACT

A permeation preventing film of a silicon nitride film 16 is inserted between a silicon substrate 10 and a High-k gate insulation film 18 to thereby prevent the High-k gate insulation film 18 from being deprived of oxygen, while oxygen anneal is performed after a gate electrode layer 20 has been formed to thereby supplement oxygen. The silicon nitride film 16, which is the permeation preventing film, becomes a silicon oxide nitride film 17 without changing the film thickness, whereby characteristics deterioration of the High-k gate insulation film 18 due to the oxygen loss can be prevented without lowering the performance of the transistor. The semiconductor device having the gate insulation film formed of even a high dielectric constant material can be free from the shift of the threshold voltage.

12 Claims, 5 Drawing Sheets

SEMICONDUCTOR DEVICE AND METHOD FOR FABRICATING THE SAME

CROSS-REFERENCE TO RELATED APPLICATIONS

This application is based upon and claims priorities of Japanese Patent Application No. 2005-092227 filed on Mar. 28, 2005, the contents being incorporated herein by reference.

BACKGROUND OF THE INVENTION

The present invention relates to a semiconductor device including a gate insulation film of a high dielectric constant material, and a method for fabricating the semiconductor device.

With the recent progress of the technique for increasing the integration and speed-up of semiconductor devices, MOSFET is increasingly nanonized. As the gate insulation film is increasingly thinned with the increasing nanonization, a problem of increased gate leak current, etc. due to tunnel current, etc. become conspicuous.

To suppress this problem, various trials are made to realize a capacitance equivalent oxide thickness (CET), which is small but ensures a physical film thickness, by using the gate insulation film of a high dielectric constant material, such as $HfO_2$, $Ta_2O_5$, etc. (hereinafter called "the High-k gate insulation film").

The Patent Reference 1 is Specification of Japanese Patent Application Unexamined Publication No. 2003-303820.

However, when the gate insulation film is formed of the High-k gate insulation film, and a gate electrode of, e.g., polysilicon is formed on the gate insulation film, a problem is that the threshold voltage of the transistor is shifted from a design value.

SUMMARY OF THE INVENTION

An object of the present invention is to provide a semiconductor device having the gate insulation film formed of even a high dielectric constant material, whose threshold voltage is not shifted, and a method for fabricating the semiconductor device.

When the gate insulation film is the High-k gate insulation film, as described above, the threshold voltage of the transistor is shifted from the design value. This will be because processing following the formation of the High-k gate insulation film deprives the High-k gate insulation film of oxygen therein.

Then, to keep the High-k gate insulation film from being deprived of the oxygen, a trial that a permeation preventing film for preventing the oxygen permeation is inserted between the silicon substrate and the High-k gate insulation film is made.

However, when the film thickness of the permeation preventing film is large, the performance of the transistor is lowered, the permeation of the oxygen cannot be sufficiently prevented when the film thickness of the permeation preventing films is small.

Another trial that oxidating ambient atmospheric anneal is performed after the gate electrode of polysilicon has been formed is made, whereby loss of the oxygen in the High-k gate insulation film is supplemented.

However, the oxidating ambient atmospheric anneal for supplementing the loss of the oxygen increases the film thickness of the silicon oxide film in the interface between the silicon substrate and the High-k gate insulation film, which increases the capacitance equivalent film thickness (CET) of the gate insulation film.

The inventors of the present application made earnest studies to solve the above-described problem and have obtained the idea that a permeation preventing film of a silicon nitride film is inserted between the silicon substrate and the High-k gate insulation film to thereby prevent the High-k gate insulation film from being deprived of oxygen, and oxygen anneal is performed after the gate electrode layer is formed, whereby the silicon nitride film as the permeation preventing film becomes a silicon oxide nitride film without changing the film thickness, and the characteristics deterioration due to the oxygen loss of the High-k gate insulation film can be prevented without lowering the transistor performance.

According to one aspect of the present invention, the present invention provides a semiconductor device comprising: a semiconductor substrate; a silicon oxide nitride film formed on the semiconductor substrate; a high dielectric gate insulation film of a high dielectric constant material formed on the silicon oxide nitride film; a gate electrode layer formed on the high dielectric gate insulation film; and a source region and a drain region formed in the semiconductor substrate.

According to another aspect of the present invention, the present invention provides a method for fabricating a semiconductor device including a transistor formed on a semiconductor substrate, which comprises the steps of: forming a silicon nitride film on the semiconductor substrate; forming a high dielectric gate insulation film of a high dielectric constant material on the silicon nitride film; forming a gate electrode layer on the high dielectric gate insulation film; patterning the silicon nitride film, the high dielectric gate insulation film and the gate electrode layer to form a gate layer structure; and forming a junction region in the semiconductor substrate with the gate layer structure as a mask, and which further comprises the step of making thermal processing in an oxidating ambient atmosphere at a prescribed timing after the step of forming the gate electrode layer.

According to further another aspect of the present invention, the present invention provides a method for fabricating a semiconductor device including a p-type transistor formed in a first region of a semiconductor substrate and an n-type transistor formed in a second region of the semiconductor substrate, which comprises the steps of: forming a silicon nitride film on the semiconductor substrate; forming a high dielectric gate insulation film of a high dielectric constant material on the silicon nitride film; forming a gate electrode layer on the high dielectric gate insulation film; patterning the silicon nitride film, the high dielectric gate insulation film ad the gate electrode layer to form a first gate layer structure in the first region and a second gate layer structure in the second region of the semiconductor substrate, and forming a first junction region in the first area of the semiconductor substrate with the first gate layer structure as a mask, and a second junction region in the second area of the semiconductor substrate with the second gate layer structure as a mask, and which further comprises the step of making thermal processing in an oxidating ambient atmosphere at a prescribed timing after the step of forming the gate electrode layer.

The present invention can fabricate a semiconductor device including the gate insulation film of a high dielectric constant material, which can prevent the characteristics deterioration due to the oxygen loss of the gate insulation film of the high dielectric constant material and which is free from the shift of the threshold voltage.

DETAILED DESCRIPTION OF THE INVENTION

A First Embodiment

Figure 1:
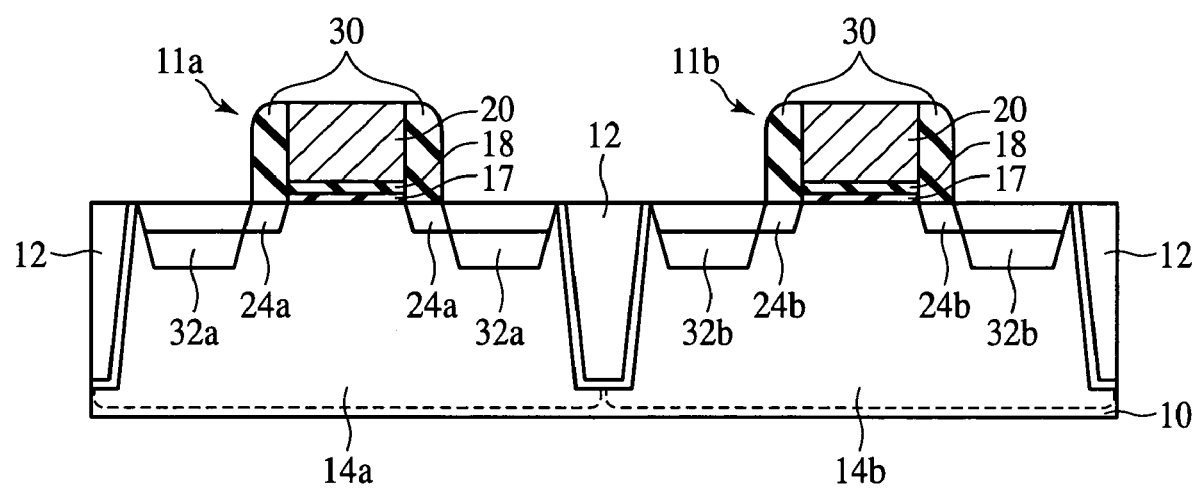
FIG. 1 is a sectional view of the semiconductor device according to one embodiment of the present invention.

The semiconductor device fabricating method according to a first embodiment of the present invention will be explained with reference to FIGS. 1 to 5. FIG. 1 is a sectional view of the semiconductor device according to the present embodiment, which illustrates the structure thereof. FIGS., 2 to 4 are sectional views of the semiconductor device according to the present embodiment in the steps of the method for fabricating the semiconductor device, which illustrate the method.

(Semiconductor Device)

The structure of the semiconductor device according to the present embodiment will be explained with reference to FIG. 1.

The semiconductor device according to the present embodiment includes a p-MOS transistor formed in an n-type well region 14a and an n-MOS transistor 11b formed in a p-type well region 14b. The n-type well region 14a and the p-type well region 14b are defined by device isolation regions 12 formed in a silicon substrate 10.

An about 0.5-1 nm-thickness silicon oxide nitride film 17 is formed on the n-type well region 14a. An about 0.5-3 nm-thickness High-k gate insulation film 18 of a high dielectric constant material, $HfO_2$ is formed on the silicon oxide nitride film 17. The silicon oxide nitride film 17 and the High-k gate insulation film 18 function as the gate insulation film.

An about 50-200 nm-thickness gate electrode 20 of polysilicon are formed on the High-k gate insulation film 18. An about 10-100 nm-thickness sidewall insulation film 30 is formed on the side walls of the gate layer structures of the silicon oxide nitride film 17, the High-k gate insulation film 18 and he gate electrode 20.

In the n-type well region 14a, p-type shallow junction regions 24a are formed in alignment with the gate electrode 20. P-type deep junction regions 32a are formed in alignment with the gate electrode 20 and the sidewall insulation film 30. A p-MOS transistor 11a of the LDD (Lightly Doped Drain) structure having the p-type shallow junction regions 24a and the p-type deep junction regions as the source region and the drain region is formed.

On the p-type well region 14b, the about 0.5-1 nm thickness silicon oxide nitride film 17 is formed. The about 0.5-3 nm-thickness High-k gate insulation film of the high dielectric constant material is formed on the silicon oxide nitride film 17. The silicon oxide nitride film 17 and the High-k gate insulation film 18 function as the gate insulation film.

An about 50-200 nm-thickness gate electrode 20 of polysilicon is formed on the High-k gate insulation film 18. The about 10-100 nm-thickness sidewall insulation film 30 is formed on the side wall of the gate layer structure of the silicon oxide nitride film 17, the High-k gate insulation film 18 and the gate electrode 20.

In the p-type well region 14b, n-type shallow junction regions 24b are formed in alignment with the gate electrode 20, and n-type deep junction regions 32b are formed in alignment with the gate electrode 20 and the sidewall insulation film 30. An n-MOS transistor 11b of the LDD (Lightly Doped Drain) structure having the n-type shallow junction region 24b and the n-type deep junction region 32b as the source region and the drain region is formed.

The high dielectric constant material forming the High-k gate insulation film 18 may be an Hf-based high dielectric constant material, other than $HfO_2$, such as $HfSiO_x$, HfON, $HfAlO_x$, HfAlON, HfON or others; a Ta-based high dielectric constant material, such as $Ta_2O_5$, TaON or others; a Zr-based high dielectric constant material, such as ZrO, ZrSiO, ZrSiON or others; an Al-based high dielectric constant material, such as $Al_2O_3$, AlON or others; or others.

(Method for Fabricating Semiconductor Device)

The method for fabricating the semiconductor device according to the present embodiment will be explained with reference to FIGS. 2 to 5.

Figure 2A:
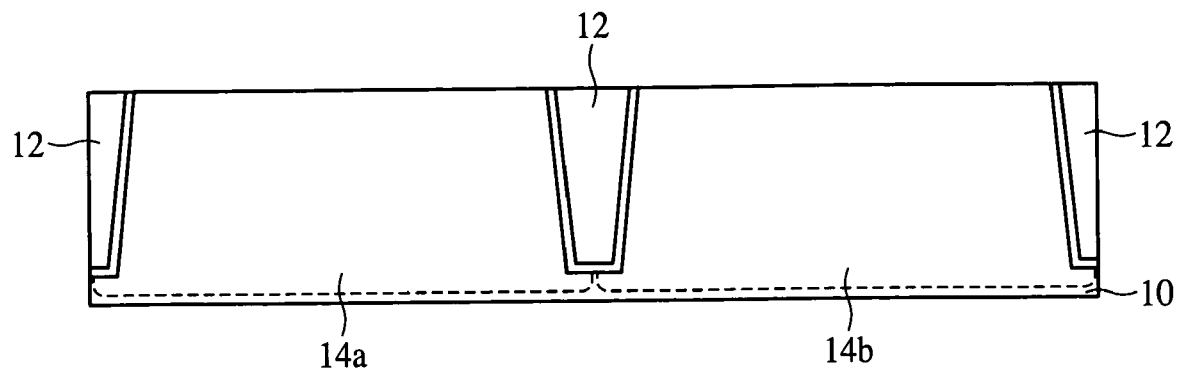
FIG. 2 is sectional views of the semiconductor device according to the embodiment of the present invention in the steps of the method for fabricating the semiconductor device, which illustrate the method (Part 1).

In the step of FIG. 2A, the device isolation regions 12 are formed in the silicon substrate 10 by STI (Shallow Trench Isolation) technique. Specifically, trenches are formed in the silicon substrate 10 by trench etching, and a silicon oxide film is filled in the trenches by the thermal oxidation of the inside walls of the trenches and CVD and is planarized to form the device isolation regions 12.

The silicon substrate 10 may be a bulk substrate or an SOI (silicon On Insulator) substrate. The use of the SOI substrate decreases the parasitic capacitance due to the depletion layer generated between the source/drain regions and the substrate in a later step to improve the operation speed of the transistors. The STI technique is the known process.

In the step of FIG. 2A, furthermore, an n-type impurity ions, such as $As^+$, $P^+$ or others, are implanted in the p-MOS region of the silicon substrate 10, and in the n-MOS region, p-type impurity ions, such as $B^+$, $BF_2^+$ or others, are implanted. Thus, the n-type well region 14a and the p-type well region 14b are respectively formed.

Figure 2B:
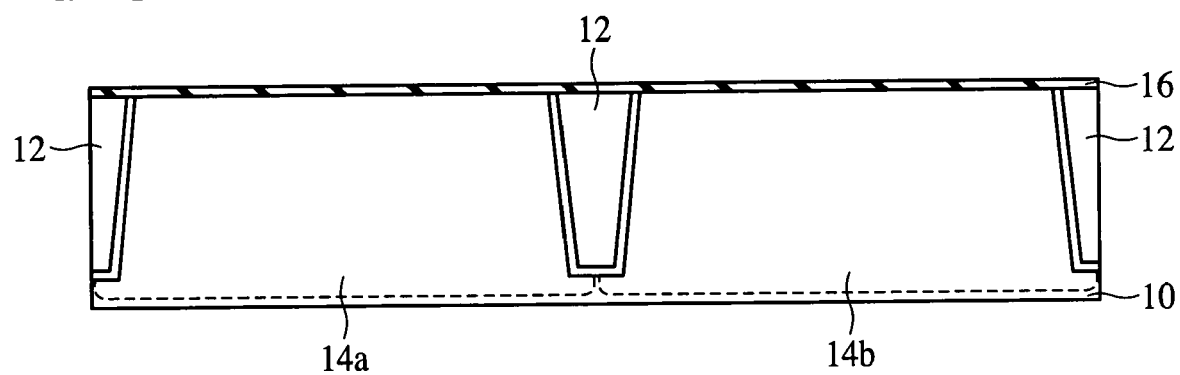

Then, in the step of FIG. 2B, silicon natural oxide film (not illustrated) on the surface of the silicon substrate 10 is removed by HF (hydrofluoric acid) processing, and a silicon nitride of, e.g., an about 0.5-1 nm-thickness is formed by CVD, direct nitriding or sputtering.

Specifically, in the CVD, the surface of the silicon substrate 10 is exposed to an atmosphere of silicon raw material, and a nitriding gas or nitrogen plasmas to thereby form the silicon nitride film 16. At this time, the temperature of the silicon substrate is preferably higher than the room temperature.

In the sputtering, silicon raw material is sputtered in nitrogen atmosphere to thereby form the silicon nitride film 16.

Figure 2C:
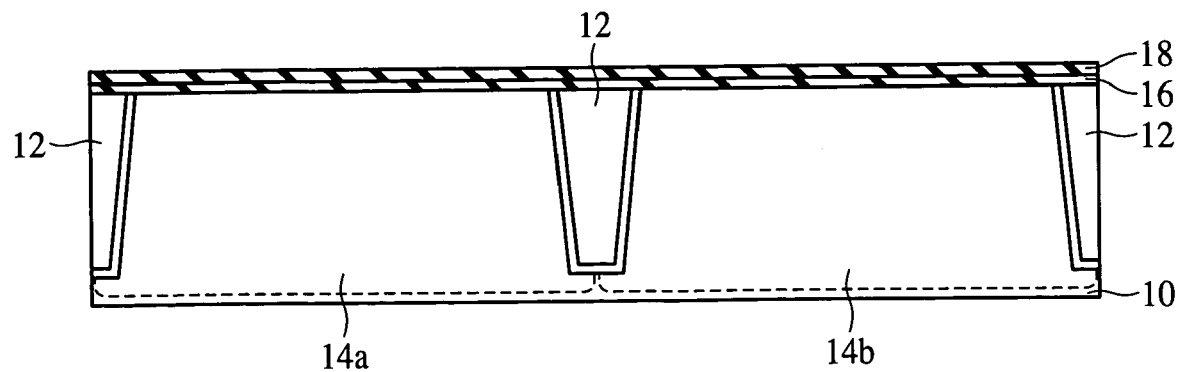

Then, in the step of FIG. 2C, the 1-3 nm-thickness High-k gate insulation film 18 of, e.g., $HfO_2$, which is a high dielectric constant material, is formed further on the silicon nitride film 16 by CVD or sputtering.

Specifically, in the CVD, the High-k gate insulation film 18 is formed, e.g., by setting the substrate temperature at above 200 C. including 200 C. and feeding Hf raw material and Si raw material, and an oxidating gas or a nitriding gas are fed concurrently or in turn.

In the sputtering, silicon raw material and Hf raw material are sputtered in, e.g., a nitriding gas or an oxidating gas to form the High-k gate insulation film 18.

The high dielectric constant material forming the High-k gate insulation film 18 may be an Hf-based high dielectric constant material other than $Hf_2$, such as $HfSiO_x$, HfON, $HfAlO_x$, HfAlON, HfON or others; a Ta-based high dielectric constant material, such as $Ta_2O_5$, TaON or others; a Zr-based high dielectric constant material, such as ZrO, ZrSiO, ZrSiON or others; an Al-based high dielectric constant material, such as $Al_2O_3$, AlON or others; or others.

Next, in the step of FIG. 3A, an about 50-200 nm-thickness non-doped polysilicon film 20 (to be the gate electrodes later) is formed on the High-k gate insulation film 18 by CVD.

Specifically, the 50-200 nm-thickness polysilicon film 20 is formed by, e.g., low-pressure CVD under a 10-50 Pa chamber internal pressure, at a 600-650 C substrate temperature and with monosilane gas fed for 5-60 minutes at a flow rate of 50-300 sccm. A doped polysilicon film doped with $P^+$ or $B^+$ may be formed by mixing $PH_3$ gas or others.

Figure 3A:
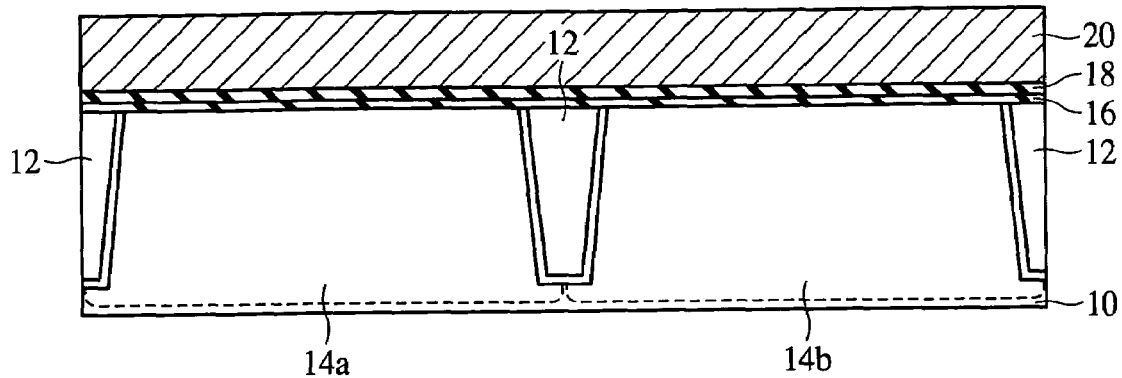
FIG. 3 is sectional views of the semiconductor device according to the, embodiment of the present invention in the steps of the method for fabricating the semiconductor device, which illustrate the method (Part 2).
Figure 3B:
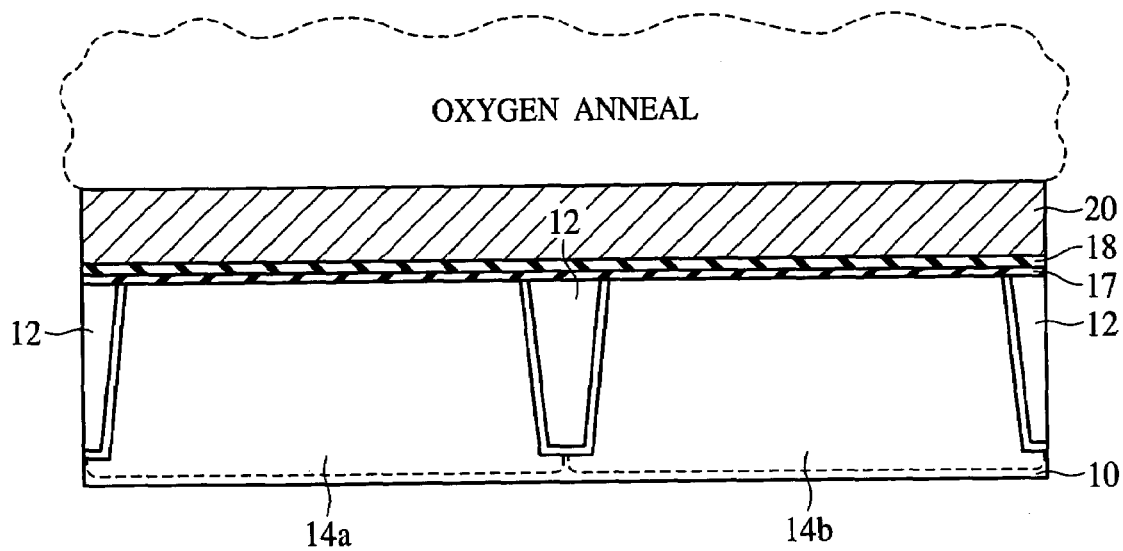

Next, in the step of FIG. 3B, oxygen anneal is performed.

Specifically, the High-k gate insulation film is oxygen annealed under a 1-100 Pa chamber internal pressure, at a 200-1000 C substrate temperature and with a mixed gas of oxygen gas and an inert gas (e.g., nitrogen) fed for 5-10 minutes at a 10-1000 sccm flow rate. Preferably, the High-k gate insulation film 18 is oxygen annealed at a 600 C. substrate temperature and with a mixed gas of oxygen gas and an inert gas (e.g., nitrogen) fed for 300 second at a 300 sccm flow rate.

Lost oxygen of the High-k gate insulation film 18 is thus supplemented. Because of the silicon nitride film 16 as the permeation preventing film formed between the silicon substrate 10 and the High-k gate insulation film 18, the oxygen of the High-k gate insulation film 18 never goes through the permeation preventing film into the silicon substrate 10.

By the oxygen anneal, the silicon nitride film 16 becomes the silicon oxide nitride film 17 without changing the film thickness. Accordingly, no characteristics deterioration, such as threshold voltage changes, etc., of the transistors is caused.

Figure 3C:
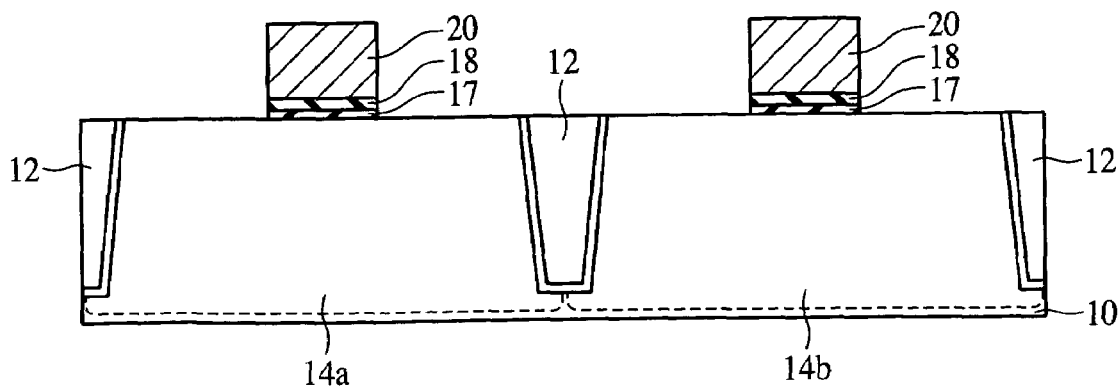

Next, in the step of FIG. 3C, a resist film (not illustrated) is formed on the polysilicon film 20 and is patterned by photolithography to leave the resist film in the regions which are to be the gate electrodes. Then, with the resist film as the mask, the polysilicon film 20, the High-k gate insulation film 18 and the silicon oxide nitride film 17 are etched to form the gate layer structure of the gate electrodes 20, the High-k gate insulation film 18, which is the gate insulation film, and the silicon oxide nitride film 17. The gate length is set in the range of, e.g., 10-90 nm.

Figure 4A:
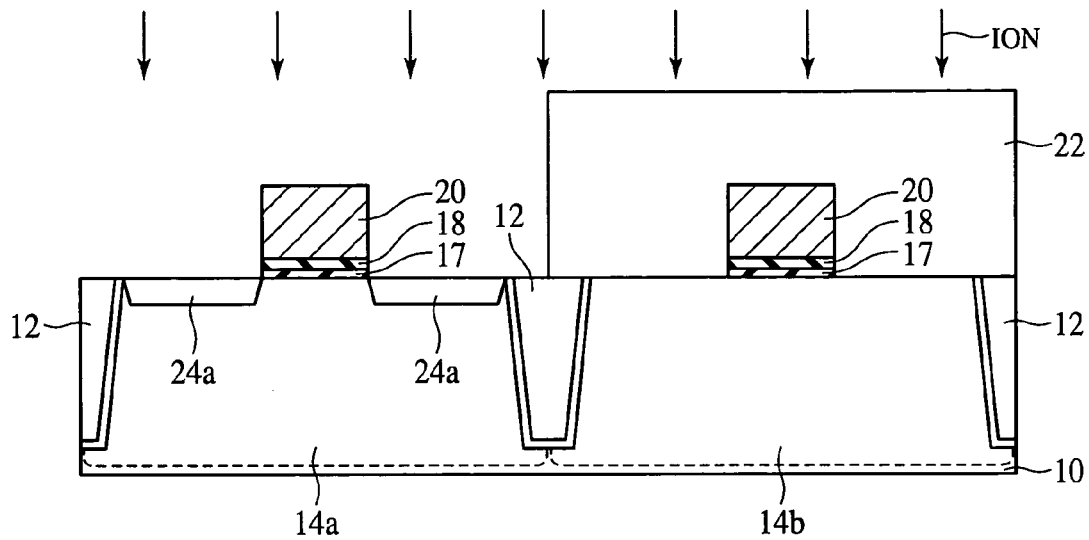
FIG. 4 is sectional views of the semiconductor device according to the embodiment of the present invention in the steps of the method for fabricating the semiconductor device, which illustrate the method (Part 3).

Then, in the step of FIG. 4A, a resist film 22 which masks the n-MOS region and opens the p-MOS region is formed. Then, with the resist film 22 and the gate electrode 20 of the p-MOS region as the mask, a p-type impurity is implanted, by ion implantation, in the n-type well region 14a on both sides of the gate electrode 20 to form the shallow junction regions 24a. Specifically, the p-type impurity is, e.g., $B^+$, the acceleration energy is 1 keV, and the dose is $4 \times 10^{14}$ $cm^{-2}$.

Figure 4B:
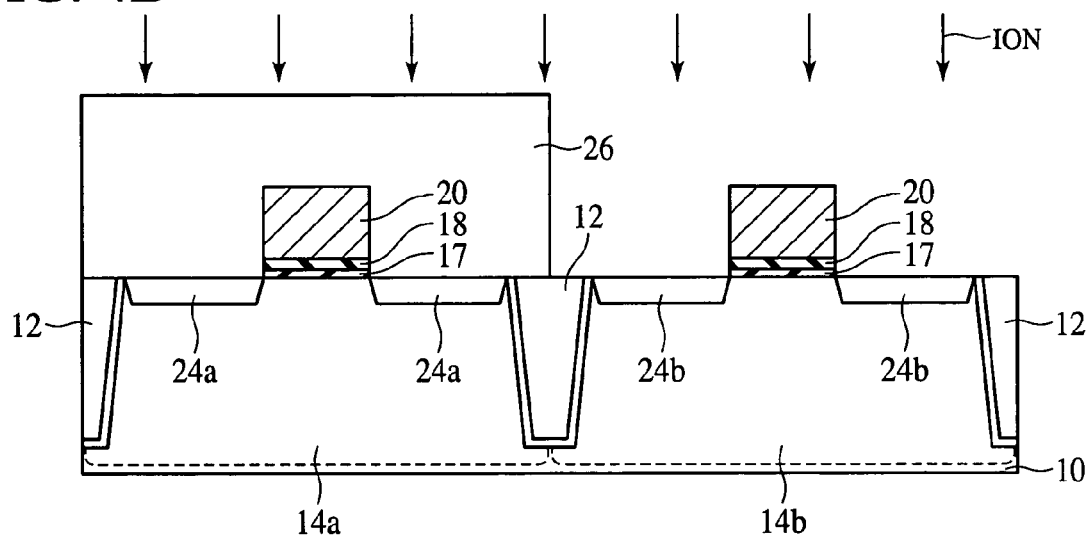

Then, in the step of FIG. 4B, the resist film 22 is removed, and a resist film 26 which masks the p-MOS and opens the n-MOS is formed. Then, with the resist film 26 and the gate electrode 20 of the n-MOS region as the mask, an n-type impurity is implanted, by ion implantation, in the p-type well region 14b on both sides of the gate electrode 20 to form the shallow junction regions 24b. Specifically, the n-type impurity is, e.g., $As^+$, the acceleration energy is 2 keV, and the dose is $5 \times 10^{14}$ $cm^{-2}$.

Figure 4C:
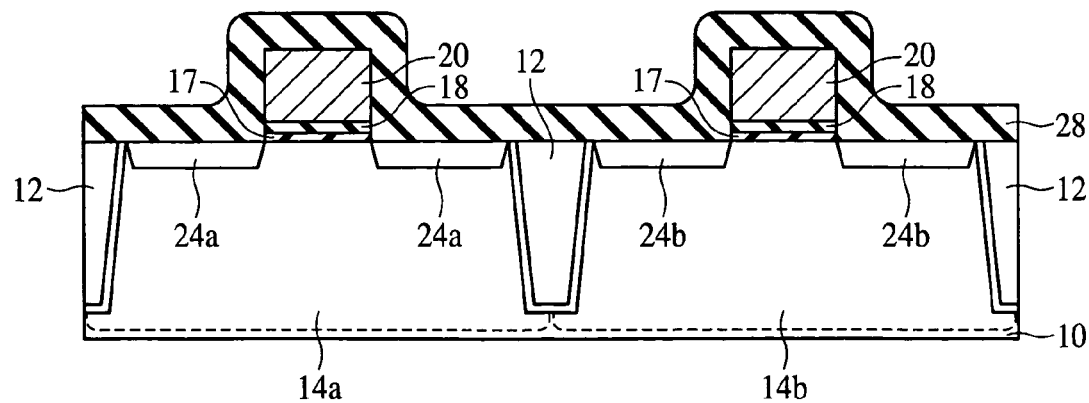

Then, in the step of FIG. 4C, a 10-100 nm-thickness silicon nitride film 28 is formed by CVD, covering the structure in FIG. 4B.

Specifically, a 10-100 nm-thickness silicon nitride film 28 is formed at a 600-800 C substrate temperature by low pressured CVD using TEOS.

Figure 5A:
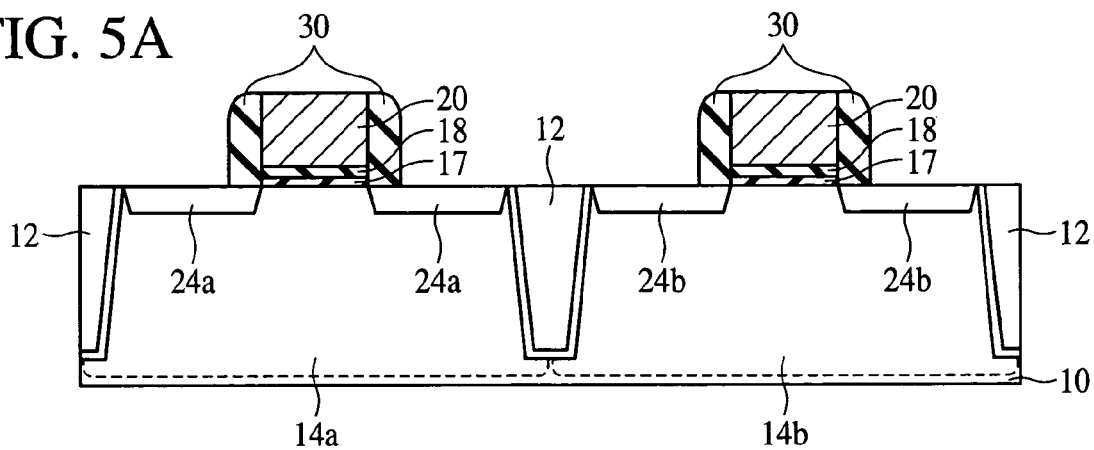
FIG. 5 is sectional views of the semiconductor device according to the embodiment of the present invention in the steps of the method for fabricating the semiconductor device, which illustrate the method (Part 4).

Next, in the step of FIG. 5A, the silicon nitride film is anisotropically etched by RIE until the surface of the silicon substrate 10 is exposed to form the sidewall insulation film 30 of the silicon nitride film covering the both sides of the gate electrodes 20, the High-k gate insulation film 18 and the silicon oxide nitride film 17.

Specifically, the etching gas for the RIE is hydrofluorocarbon, such as difluoromethane ($CH_2F_2$), 1,1-difluoroethane ($C_2H_4F_2$) or others, and the thickness of the sidewall insulation film 30 is set in the range of 10-100 nm.

Figure 5B:
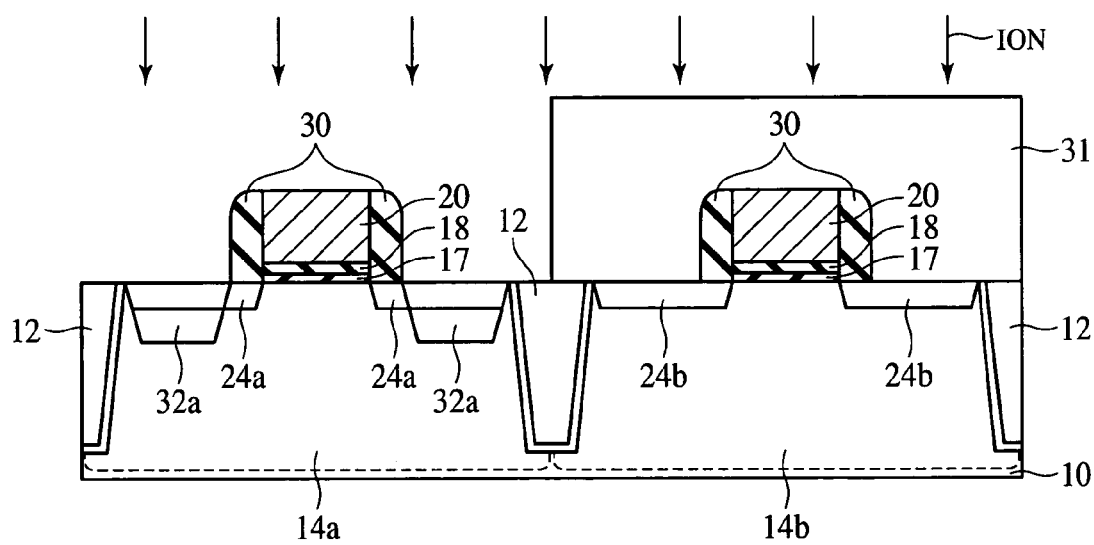

Then, in the step of FIG. 5B, a resist film 31 which masks the n-MOS region and opens the p-MOS region is formed. Then, with the resist film 31, the gate electrode 20 of the p-MOS region and the sidewall insulation film 30 as the mask, a p-type impurity is implanted, by ion implantation, in the n-type well region 14a on both sides of the gate electrode and the gate sidewall insulation film 30 to form the deep junction regions 32a. Specifically, the p-type impurity is, e.g., $B^+$, and the acceleration energy is 6 keV, and the dose is $4 \times 10^{15}$ $cm^{-2}$.

Figure 5C:
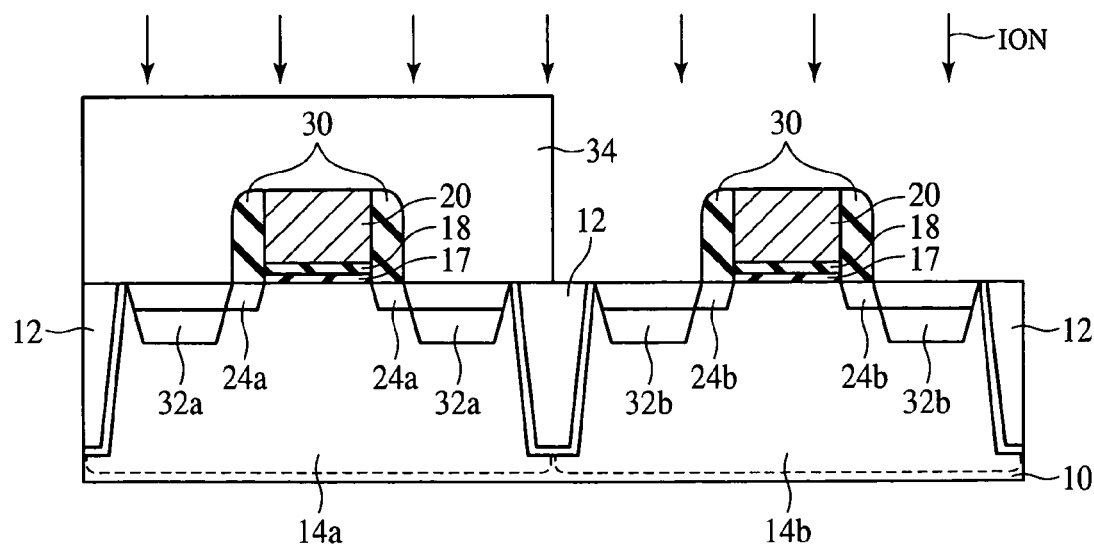

Then, in the step of FIG. 5C, the resist film 31 is removed, and a resist film 34 which masks the p-MOS region and opens the n-MOS region is formed. Next, with the resist film 34, the gate electrode 20 of the n-MOS region and the sidewall insulation film 30 as the mask, an n-type impurity is implanted in the p-type well 14n on both sides of the gate electrode 20 and the sidewall insulation film 30 to form the deep junction regions 32b. Specifically, the n-type impurity is, e.g., $As^+$, the acceleration energy is 10 keV, and the dose is $4 \times 10^{15}$ $cm^{-2}$.

Then, the resist film 34 is removed, and then the junction regions 24a, 24b, 32a, 32b are activated. Thus fabricated is the semiconductor device including, as illustrated in FIG. 1, the p-MOS transistor 11a of the LDD (Lightly Doped Drain) structure having the p-type shallow junction regions 24a and the p-type deep junction regions 32a as the source region and the drain region, and the n-MOS transistor 11b of the LDD (Lightly Doped Drain) structure having the n-type shallow junction regions 24b and the n-type deep junction regions 32b as the source region and the drain region.

According to the method for fabricating the semiconductor device according to the present embodiment, the permeation preventing film of a silicon nitride film is provided between the silicon substrate and the High-k gate insulation film, and oxygen anneal is performed after a polysilicon film has been formed to thereby supplement oxygen of the High-k gate insulation film, whereby the High-k gate insulation film is prevented from being deprived of oxygen, and a silicon nitride film which is the permeation preventing film becomes a silicon oxide nitride film without changing the film thickness. Accordingly, the characteristics deterioration of the High-k gate insulation film due to the oxygen loss can be prevented without lowering the performance of the transistors.

Modified Embodiments

The present invention is not limited to the above-described embodiment and can cover other various modifications.

For example, in the above-described embodiment, the oxygen anneal for preventing the characteristics deterioration due to the oxygen loss of the High-k gate insulation film is performed after the polysilicon film 20 has been formed in the step of FIG. 3A. However, the oxygen atmospheric anneal may be performed any time after the polysilicon film 20 has been formed or may be performed by thermal processing of another step. For example, the oxygen atmospheric anneal may be performed after the gate electrodes have been formed in the step of FIG. 3C, after the shallow junction regions 24a, 24b have been formed in the step of FIG. 4C, after the silicon nitride film 28 has been formed in the step of FIG. 4C, after the sidewall insulation film 30 has been formed in the step of FIG. 5A, or after the deep junction regions 32, 32b have been formed in the step of FIG. 5C. The oxygen atmospheric anneal may be performed by thermal processing of another step, e.g., for activating the junction regions 24a, 24b, 32a, 32b.

In the above-described embodiment, the present invention is applied to a CMOS transistor including a p-MOS transistor and an n-MOS transistor. However, the present invention is applicable to a p-MOS transistor alone, an n-MOS transistor alone.

The present invention is applicable to a full-silicide gate MOS transistor. The full-silicide gate MOS transistor is fabricated by performing silicidation until above the gate electrode, when the source/drain regions and the gate electrode are silicided after the sidewall oxide film, LDD, source/drain regions have been formed.

What is claimed is:

1. A method for fabricating a semiconductor device including a transistor formed on a semiconductor substrate, which comprises the steps of:
    forming a silicon nitride film on the semiconductor substrate;
    forming a high dielectric gate insulation film of a high dielectric constant material on the silicon nitride film;
    forming a gate electrode layer on the high dielectric gate insulation film;
    patterning the silicon nitride film, the high dielectric gate insulation film and the gate electrode layer to form a gate layer structure; and
    forming a junction region in the semiconductor substrate with the gate layer structure as a mask, and
    which further comprises the step of heating the semiconductor substrate in an oxidating ambient atmosphere after the step of forming the gate electrode layer to change said silicon nitride film into a silicon oxide nitride film.

2. A method for fabricating a semiconductor device including a p-type transistor formed in a first region of a semiconductor substrate and an n-type transistor formed in a second region of the semiconductor substrate, which comprises the steps of:
    forming a silicon nitride film on the semiconductor substrate;
    forming a high dielectric gate insulation film of a high dielectric constant material on the silicon nitride film;
    forming a gate electrode layer on the high dielectric gate insulation film;
    patterning the silicon nitride film, the high dielectric gate insulation film ad the gate electrode layer to form a first gate layer structure in the first region and a second gate layer structure in the second region of the semiconductor substrate, and
    forming a first junction region in the first area of the semiconductor substrate with the first gate layer structure as a mask, and a second junction region in the second area of the semiconductor substrate with the second gate layer structure as a mask, and
    which further comprises the step of heating the semiconductor substrate in an oxidating ambient atmosphere after the step of forming the gate electrode layer to change said silicon nitride film into a silicon oxide nitride film.

3. A method for fabricating a semiconductor device according to claim 1, wherein
    the step of heating the semiconductor substrate is performed immediately after the step of forming the gate electrode layer.

4. A method for fabricating a semiconductor device according to claim 2, wherein
    the step of heating the semiconductor substrate is performed immediately after the step of forming the gate electrode layer.

5. A method for fabricating a semiconductor device according to claim 1, wherein
    the step of heating the semiconductor substrate is performed immediately after the step of forming the gate layer structure.

6. A method for fabricating a semiconductor device according to claim 2, wherein
    the step of heating the semiconductor substrate is performed immediately after the step of forming the gate layer structure.

7. A method for fabricating a semiconductor device according to claim 1, wherein
    the high dielectric constant material of the high dielectric gate insulation film is $HfO_2$, $HfSiO_x$, HfON, $HfAlO_x$, HfAlON, HfON, $Ta_2O_5$, TaON, ZrO, ZrSiO, ZrSiON, $Al_2O_3$ or AlON.

8. A method for fabricating a semiconductor device according to claim 2, wherein
    the high dielectric constant material of the high dielectric gate insulation film is $HfO_2$, $HfSiO_x$, HfON, $HfAlO_x$, HfAlON, HfON, $Ta_2O_5$, TaON, ZrO, ZrSiO, ZrSiON, $Al_2O_3$ or AlON.

9. A method for fabricating a semiconductor device according to claim 1, wherein
    the film thickness of the silicon oxide nitride film is 0.5-1.0 nm.

10. A method for fabricating a semiconductor device according to claim 2, wherein
    the film thickness of the silicon oxide nitride film is 0.5-1.0 nm.

11. A method for fabricating a semiconductor device according to claim 1, wherein
    the film thickness of the high dielectric gate insulation film is 0.5-3.0 nm.

12. A method for fabricating a semiconductor device according to claim 2, wherein
    the film thickness of the high dielectric gate insulation film is 0.5-3.0 nm.

* * * * *